United States Patent [19]

Lambertsen

[11] 4,104,582

[45] Aug. 1, 1978

[54] SYSTEM FOR LOCALIZING A SPOT ALONG A CONDUCTOR IN WHICH AN IMPEDANCE CHANGE SUCH AS A BREAK OR SHORT CIRCUIT OCCURS

[75] Inventor: Ejvind Lambertsen, Fredericia, Denmark

[73] Assignee: i. c. møller a/s, Denmark

[21] Appl. No.: 752,192

[22] Filed: Dec. 20, 1976

[30] Foreign Application Priority Data

Dec. 24, 1975 [GB] United Kingdom ............... 52789/75

[51] Int. Cl.² ........................................ G01R 31/11
[52] U.S. Cl. ............................ 324/52; 179/175.3 F
[58] Field of Search .................. 324/52, 57 PS, 58 B, 324/58.5 B; 343/17.2 R, 17.2 PC, 17.1 R; 332/9 R; 325/142; 179/175.3 F

[56] References Cited

U.S. PATENT DOCUMENTS

| 2,602,834 | 7/1952 | Leslie et al. .......................... 324/52 |
| 2,651,752 | 9/1953 | Devot .................................... 324/52 |
| 3,014,215 | 12/1961 | MacDonald ..................... 343/17.1 R |
| 3,211,997 | 10/1965 | Hara ....................................... 324/52 |
| 3,244,978 | 4/1966 | Craven et al. ..................... 324/52 X |
| 3,647,298 | 3/1972 | Soules .......................... 343/17.2 R X |
| 3,753,086 | 8/1973 | Shoemaker ........................... 324/52 |
| 3,911,358 | 10/1975 | Shalyt et al. .......................... 324/52 |

FOREIGN PATENT DOCUMENTS 2,318,424 10/1974 Fed. Rep. of Germany ............. 324/52

OTHER PUBLICATIONS

Allan, A.F.G. Pinpointing Cable Faults, Post Off. Telecommunication J. (G.B.), vol. 22, No. 4 (1970-1971).

Primary Examiner—Gerard R. Strecker
Attorney, Agent, or Firm—Craig & Antonelli

[57] ABSTRACT

A measuring system for localizing a defect spot along a wire or along an insulated pipe having incorporated a wire in its insulation, comprising a pulse generator transmitting to one end of the wire consecutive trains of electric pulses, these pulses in each train being of steadily increasing or decreasing duration, an associated detector receiver for receiving through said wire end pulses reflected from said spot and designed so as to produce a detector signal in response to reception of a reflected pulse front substantially concurrently with the termination of the transmission of the pulse to which said pulse front belongs, and indicator means operable to identify each of the individual pulses in response to occurrence of said detector signal, whereby the duration of the pulse thus identified will be indicative of its running time to and from the defect pulse reflecting spot and therewith be indicative of the distance from the wire end to the spot. Preferably the indicator means is a counter operable to successively count the consecutive pulses, these being generated with a constant predetermined pulse frequency, and to stop or read out the count in response to occurrence of the detector signal, whereby it is possible to produce a direct digital reading of the location of the defect spot.

12 Claims, 9 Drawing Figures

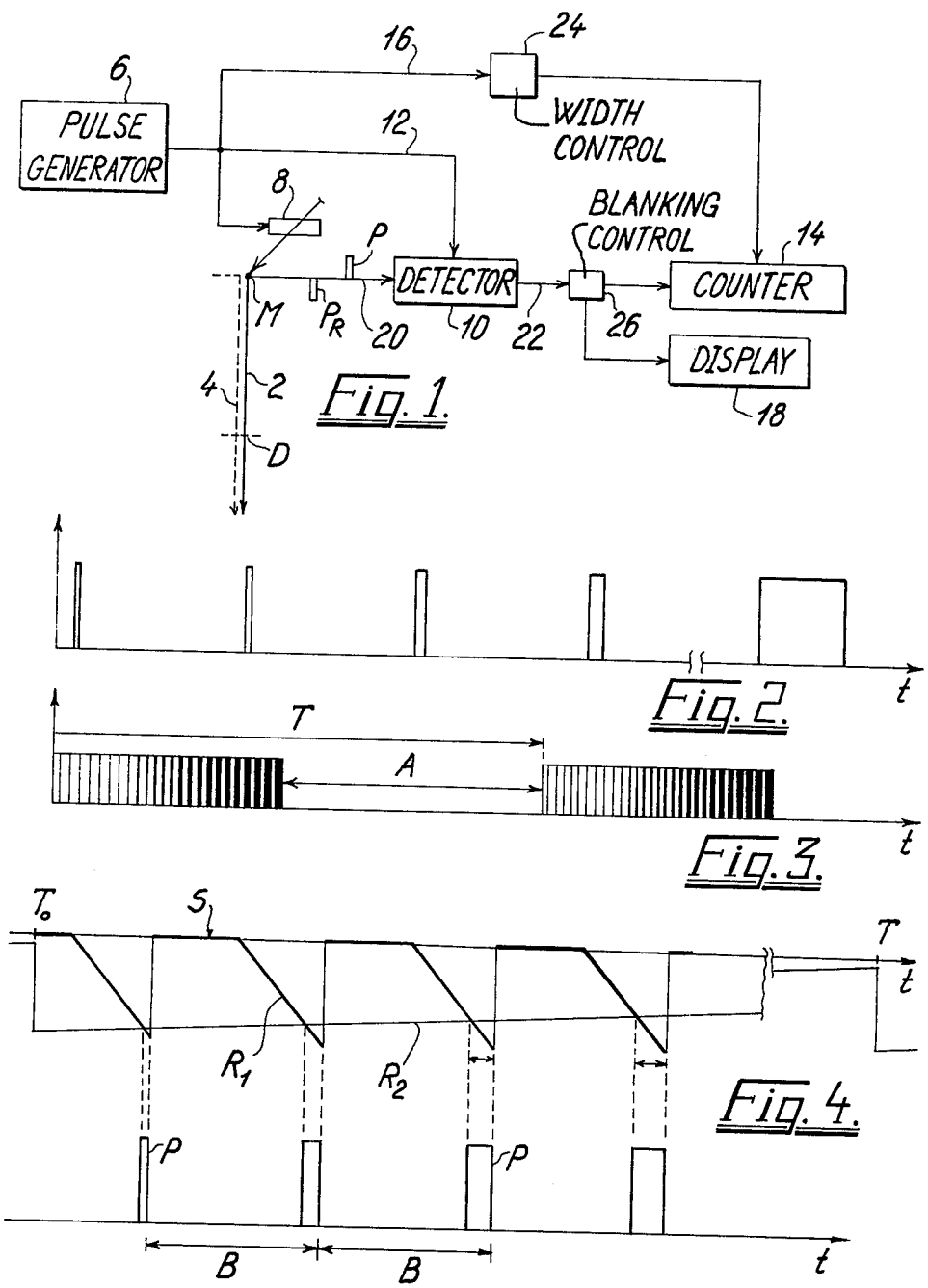

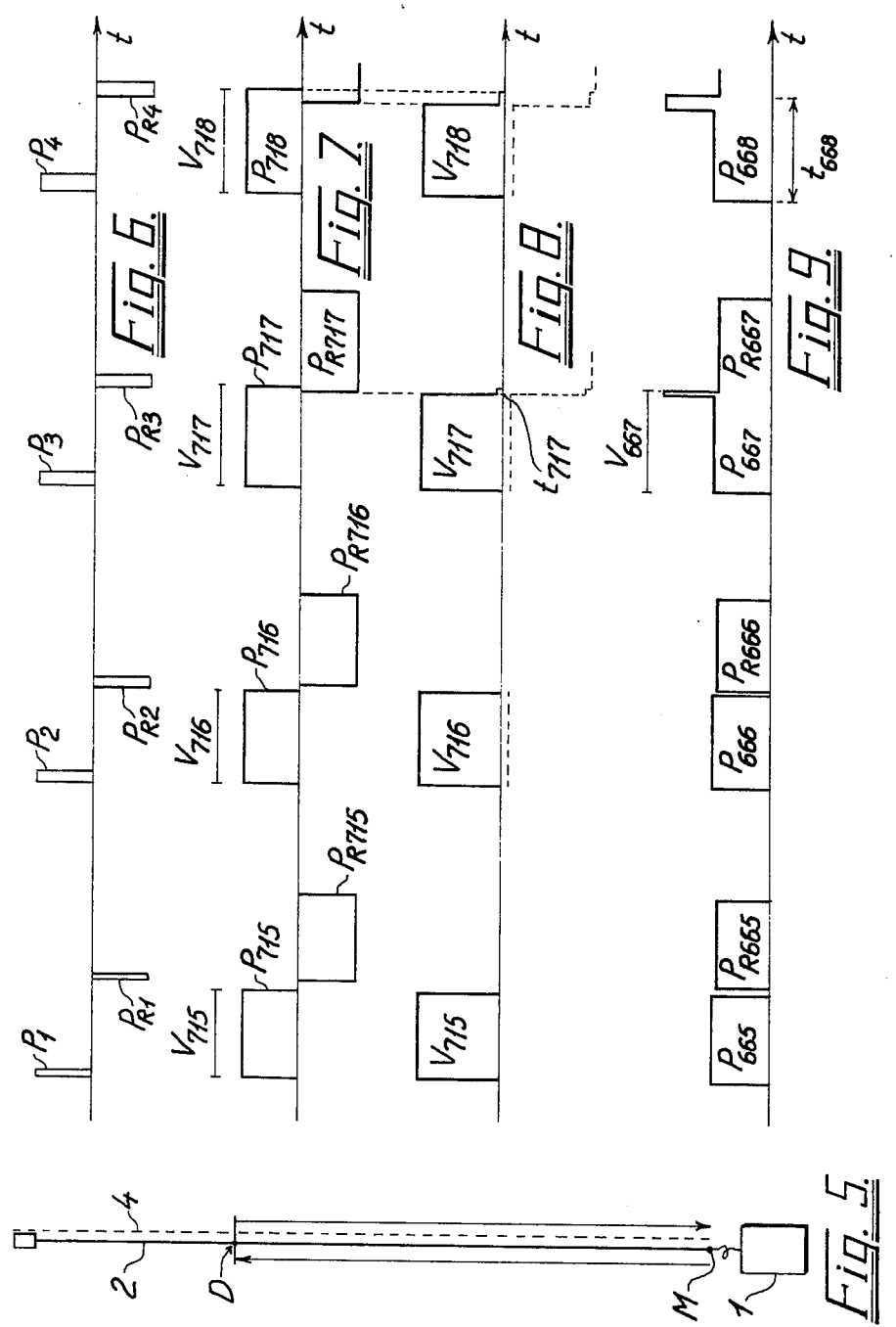

SYSTEM FOR LOCALIZING A SPOT ALONG A CONDUCTOR IN WHICH AN IMPEDANCE CHANGE SUCH AS A BREAK OR SHORT CIRCUIT OCCURS

The present invention relates to a system for localizing a spot along an electric conductor in which an impedance change such as a break or a short circuit occurs. Normally such a spot will constitute a defect which should be localized and repaired, and several measuring systems have been developed for enabling a localization by electric measurement from one or both ends of the conductor length. The conductor may be an electric cable or wire or even a metallic pipe in ordinary use, or it may be a wire extending along some elongated structure and serving to enable detection of some types of physical changes in the surroundings somewhere along the structure. A specific example is the use of an electric wire incorporated in the insulation of heat insulated pipes in subterranean pipe systems e.g. for district heating; in such pipes the insulation is protected by an outer mantle tube for preventing intrusion of water which would make the insulation ineffective and give rise to corrosion on the metallic conductor pipe. With the use of said electric wire or more such wires it is possible to electrically detect a possible intrusion of water or moisture in the dry insulation material, and even the location of the defect spot may be determined because of the local impedance change caused by the moisture. A more or less expressed short circuit is established between the wire and another wire or the ground, and an elementary manner of localizing the defect would be to carry out a so called bridge measurement from both ends of the wire.

However, more convenient measuring methods have been developed, base on the fact that a wire portion located in changed impedance surroundings is able to reflect an electric pulse fed to one end of the wire, so it is sufficient to measure from one wire end the travelling time of a pulse running from the wire end (or the measuring device) and back again upon being reflected from the "defect" spot.

More specifically the invention relates to a measuring system of this latter type, i.e. a system comprising pulse generator means for transmitting a series of electric pulses to the conductor from one end thereof, and associated receiver means for detecting the return of pulses reflected from said changed impedance spot, said generator and receiver means being connected to indicator means, operable to detect the time interval between transmission and reception of a reflected pulse and to produce a corresponding indication of the location of said spot.

In a well known system of this type pulses of extremely short duration are repeatedly sent out along the cable, and the return of the reflected pulses is registered by means of an oscilloscope working with extremely high sweep velocity, whereby the reflection will be seen as a blip somewhere along the time axis on the screen, the position of the blip on this axis being representative of the location of the defect to be localized. In practice, however, the time axis is of short length, whereby the measuring accuracy is not very high, and it would be rather difficult to effect reading of the measuring result on anything else than an oscilloscope.

Another known pulse measuring system makes use of pulses of relatively long duration, namely so long that the front of the pulse may reach the opposite end of the supervised cable length and be reflected back again, before the pulse is terminated. The voltage measured at the end of the cable from which the pulse is transmitted will then be the pulse voltage until the reflected signal arrives at the measuring point, whereafter the voltage measured is the voltage of the generated pulse superimposed by the voltage of the reflected pulse. The resulting voltage change is detectable on an oscilloscope, but again the measuring accuracy as to the location of the defect will be rather poor. In both systems it would be possible with the so-called "sampling" technique, involving stepwise detection of the readings in many points of the time axis on the oscilloscope, to obtain more accurate readings, but this would be a rather expensive solution, and besides the very use of an oscilloscope normally requires highly skilled operators.

It is the purpose of this invention to provide a measuring system enabling said spot of changed impedance to be detected and localized with a high degree of accuracy and with a relatively inexpensive equipment.

According to the invention there is provided a system of the said type in which said pulse generator means are operable to produce a series of pulse trains each comprising a series of pulses of individual durations or widths, preferably of steadily increasing or decreasing widths, ranging between a minimum width corresponding to the pulse running to and back again from a conductor point relatively close to said conductor end and a maxiumum width corresponding to the pulse running to and back again from at least a point near the opposite end of the conductor length to be supervised, said indicator means comprising detector means responsive to reception of a reflected pulse front when this reception coincides substantially with the termination of the individual pulse giving rise to the reflection of said pulse front, and pulse identification means operable to produce information selectively indicative of the single individual pulses, said detector means being operatively connected with said pulse identification means so as to cause the latter to produce information identifying the pulse giving rise to said detector response.

In this system the response of the detector means will occur at the moment the respective individual pulse has a width or duration just corresponding to a running time to and from the pulse reflecting spot, and the particular pulse will be automatically identified by said pulse identification means. As thus its duration is known the identified pulse will enable the distance to the reflecting spot to be found. Principally there are no problems corresponding to the short time base of the oscilloscope, because there is no need to use any time base corresponding to the pulse running time to and from the outer end of the wire. The said individual pulses in each pulse train may if so desired be sent out at arbitrary moments of time, and each train of pulses may comprise as many individual pulses as desired; thus the pulses may represent extremely short mutual time differences, and therewith condition a high accuracy of the localization of the reflecting spot.

In a preferred embodiment of the system according to the invention the pulses in each pulse train are generated with a constant, predetermined frequency and so as to be of steadily increasing or decreasing duration, and the pulse identification means is a simple counter for the consecutive pulses; when the detector responds to the characteristic pulse having occurred the counting is caused to stop, and the pulse is identified by a digital display showing the counter step. It is possible in this way to obtain a digital reading which simply shows the number of meters (or other length units) from the measuring point to the reflecting point, and the system accordingly may be designed as a robust measuring device which is usable without any special skill.

In the following the invention is explained in more detail with reference to the accompanying drawing, in which:

FIG. 1 is a schematic diagram of a measuring system according to the invention,

FIG. 2 is an illustration of single consecutive pulses in a train of pulses,

FIG. 3 is an illustration of two consecutive trains of pulses,

FIG. 4 is an illustration of the manner in which the consecutive pulses are produced, FIG. 5 is an illustration of a supervised cable length in which a defect occurs, and FIGS. 6-9 are graphic views illustrating the manner of detecting the location of the defect.

The arrangement shown in FIG. 1 comprises a cable length 2 to be supervised, or which has been found to be defective by way of a short circuit somewhere along its length, and it is desired to localize the defect D. A measuring system is connected to one end M of the cable in order to determine the distance from M to D by way of pulse reflection from D. The main components and function of the measuring system are as follows:

A pulse generator 6 produces repeatingly a series of successive pulses of constant pulse frequency, but of gradually increasing pulse width as illustrated in FIG. 2. The consecutive pulse series as illustrated in FIG. 3 are applied to the measuring end M of the wire 2 through an impedance 8. The pulse trains are additionally supplied as strobe pulses to a detector 10 through a wire 12, and moreover the pulses are supplied to a counter 14 through a wire 16, the counter 14 being adapted to consecutively count the single pulses in each series of pulses and to operate a digital display unit 18 serving as a count indicator. The wire end M is connected to the input of the detector 10 through a wire 20, and the output of the detector is fed to the counter 14 through a wire 22.

Briefly, each single pulse supplied to the point M from the pulse generator 6 will be fed to the detector 10 through the wire 20 partly as a main pulse P direct from the point M and partly as a reflected pulse $P_R$, the latter being reflected from the point of defect D. The characteristic impedance of the pulse generator and the cable 2 are so adapted that no pulse reflection will take place if there is no defect in the pipe and wire length to be supervised, and in that case the detector 10 will receive the main pulses P only. If a defect D occurs the first short pulses in each pulse series may be of such small width that the main pulse P as illustrated in FIG. 1 will be received by the detector prior to reception of the reflected pulse $P_R$, but as the following pulses get wider a situation will occur in which the main pulse is of a width corresponding to the running time of the front of the pulse to the defect point D and back to the detector, whereby the detector will receive at the same time both the main pulse voltage and the voltage of the reflected pulse, and the detector 10 is adapted so as to produce an output signal in response to this situation being reached. The particular pulse width will be indicative of the distance from the wire end to the defect point D, and the pulse may be identified by the output signal of the detector 10 being fed to the counter 14 so as to cause the counter to stop at the counter stage corresponding to the number of the said particular pulse in the series of pulses.

Especially the first pulses in each series are of extremely short duration, and in order to enable the counter 14 to count these pulses the connection 16 from the pulse generator 6 to the counter 14 may include a width control unit 24 serving to increase the width of the pulses supplied to the counter 14. A further feature is a blanking control unit 26 arranged in the output wire 22 of the detector 10 and connected with the display unit 18 so as to cause the display to be operative only when the counter stage is reached in which the causes 10 cause the counter to stop; thus the display will operate intermittently and show the stop counter stage every time it is being reached by the counting of the pulses in the consecutive series of pulses, and these series may follow each other with such high frequency that in practice the display will steadily show the said stop counter stage.

In a preferred arrangement the measuring system is adapted so as to supervise a pipe and wire length 2,4 of 1 kilometer, and each pulse series includes a number of 1000 operative pulses, the consecutive differential width of which corresponds to a pulse running time of 2 meters, i.e. corresponding to a cable length of 1 meter. With such an arrangement the display 18 will count the thousand pulses (or up to 999) and the said stop counter stage will give a reading directly indicating the distance in meters from the wire end to the defect point D. Obviously, however, these parameters may be chosen to suit other requirements.

The consecutive series of pulses of varying width may be generated in one of a variety of possible manners, one being illustrated in FIG. 4 which shows the combined output signals of two so-called ramp generators, one producing a saw tooth signal S consisting of a regular train of triangular pulses of steeply inclined front sides of ramps $R_1$, while the other ramp generator produces relatively very long pulses each defined by the slightly inclined ramp $R_2$. The beginning of each ramp $R_2$ corresponds to the beginning of one of the pulse series as shown in FIG. 3, and the single pulses in the series are derived from the intersections between the ramps $R_1$ and $R_2$, whereby as shown in FIG. 4 the pulses P will be produced with consecutively increasing width throughout the period of the ramp $R_2$. However, only a partial length of the ramp $R_2$ is used for the pulse production, whereby there is provided space A, FIG. 3, between the consecutive pulse series. According to the method of producing the single pulses it will be understood that the rear sides of the rectangular pulses will be spaced evenly from each other (distance B, FIG. 4), while their front sides will occur at steadily increasing distance in front of the fixed rear sides.

FIG. 5 illustrates a pipe and wire length in which a defect has occurred at the point D situated approximately two thirds of the wire length from the measuring end M thereof. When a pulse series (FIG. 3) is transmitted the first many pulses of short width, e.g., the pulses $P_1$ and $P_2$ as shown in FIG. 6 will be reflected from the point D without the reflected pulse $P_{R1}$, $P_{R2}$, respectively, coming back to the detector before the main pulses $P_1$ and $P_2$ have terminated. As shown in FIG. 7, as the pulse width still increases, a situation will occur in which one pulse, e.g. $P_{716}$ will produce a reflected pulse $R_{R716}$, the front of which arrives to the detector very shortly upon termination of the main pulse $P_{716}$, whereafter the following reflected pulse $P_{R717}$ will arrive at the detector before termination of the associated main pulse $P_{717}$. Thereafter, of course, all subsequent pulses in the same series will be reflected so as to arrive at the detector prior to termination of their respective main pulses.

The pulses generated by the generator 6 and supplied to the detector 10 through the wire 12 are used as strobe pulses serving to actuate a circuit for detecting the voltage of the input signal on the detector and to make this detection inoperative in exact response to termination of the main pulse in question. In FIG. 7 the operative periods of the voltage measuring circuit are designated $V_{716}$ and $V_{717}$. It will be understood that during the measuring period $V_{716}$ the circuit will measure the voltage of the main pulse $P_{716}$ only, while at the end of the period $V_{717}$ the circuit will measure not only the voltage of the main pulse $P_{717}$, but additionally that of the reflected pulse $P_{R717}$, this giving rise to a sudden and substantial change of the voltage measured (whether the reflected pulse in positive or negative), and this substantial voltage change is relatively easy to detect by suitable detector means which would need no more detailed description at this place. The voltage measured is shown schematically in FIG. 8 in which the said voltage change appears at $t_{717}$.

The detector 10 produces its output signal in response to the said voltage change so as to thereby stop the operation of the counter 14 and make the display 18 operative during the remaining period of the pulse series in question. The described operation will then be repeated from the beginning of the next series of pulses.

The measuring system according to the invention is usable not only for detecting a more or less expressed short circuiting between the wire 2 and the pipe 4, but also for detecting a break of the wire 2 or any other cable to which the measuring system is adapted. If the defect point D represents a wire break the reflected pulses will be positive while they will be negative if the point represents a place of reduced impedance compared with the characteristic impedance of the generator 6 and the cable 2 in the normal condition thereof.

In FIG. 9 is illustrated the situation in which a cable break is detected. The reflected pulses are positive, and when the front of pulse $P_{667}$ returns to the detector as a reflected pulse front it will be added to the rear portion of the main pulse, whereby the resulting voltage change is detectable at the end of the $V_{667}$ measuring period just as described in connection with FIG. 8, though it may be necessary to make use of separate detector circuits for the two types of detection. FIG. 9 represents a defect occurring in a cable length of 1 kilometer at a point spaced two thirds from the measuring end thereof.

In practice the measuring system may be used either as a stationary equipment located in the field adjacent one end of the pipe and wire length to be supervised, whereby each partial section of a district heating system would require a separate measuring equipment, or the equipment may be included in a portable unit to be connected to any of a number of such partial sections. In the latter case care should be taken that the various sections are of correct impedance adaption.

Generally it will not be desirable to effect supervision of very long wire lengths, because noise signals may be liable to occur. Therefore, in case of large pipe systems such as complex district heating systems or very long oil pipe lines, both of the heat insulated type having a detector wire incorporated in the insulation, it is preferable to make use of mutually separated lengths of detector wire defining said partial sections to be individually supervised. At each mounting or connection place the measuring equipment may be used for supervising two such sections, viz, one section at both sides thereof, when suitable switch over means are used. In a double pipe system comprising two parallel pipes the measuring equipment at a given place may correspondingly supervise four of said sections, e.g., of 1 kilometer each, when it is connected successively to the four individual sections, e.g. by means of an automatic electronic switch. In a system having a plurality of such partial sections to be supervised it will even be possible to arrange for the detection results from the single sections to be transmitted to a central receiver and supervisor station, e.g. by means of carrier wave generators associated with each measuring system and each producing a carrier wave of an individual frequency which is modulated by the measuring result, if any, of the associated measuring system, whereby the readings of all the measuring systems may be transmitted to the central station through one common transmission wire.

The counter 14 should not necessarily be adapted to stop its counting in response to occurrence of the output signal from the detector 10, as the counting may well continue if it is just ensured that the display 18 will show the number of the pulse giving rise to the first reaction of the detector 10. Thus, instead of causing the counter to stop the detector output signal giving rise to the display 18 showing the relevant pulse number may cause the detector 10 to be generally inoperative during the remainder of each pulse train, so that the display 18, despite the further operation of the counter 14, will show only a glimpse of the number of the relevant pulse, but since the pulse trains may follow each other in a rapid manner these glimpses will get the character of a permanent showing, though of course the last ciffer may fluctuate especially if the reading result corresponds to a distance to the reflection point D defined midways between two consecutive pulses.

The pulses in the consecutive pulse trains should not necessarily be of steadily increasing width, since it will of course be possible to detect the reversed change between the pulses $P_{716}$ and $P_{717}$ in FIG. 7, when the pulses are of steadily decreasing width, whereby the voltage change will go in the opposite direction. In FIG. 8 it is indicated in dotted lines below the time axis that by a level transformation the drop/raise of the resulting positive pulse voltage may be converted into a raise/drop of a corresponding negative voltage, whereby a safe detection may be facilitated.

The system according to the invention does not require the pulses to be of steadily increasing or decreasing width or to occur with any constant frequency, when only means are provided for identifying the single individual pulses in response to occurrence of the detector signal. In a simplified embodiment of the system it will be sufficient to use a generator 10 producing pulses of varying widths in response to manual (or motorized) operation of a dial, while the detector 10 is connected to a signal lamp such that actuation of the lamp will be indicative of the pulses changing their width beyond the pulse width corresponding to detection of a reflecting spot of the wire, and the measuring result is then given by reading the particular position of the dial.

Finally it should be mentioned that the discussed spot of changed impedance should not necessarily be indicative of a defect, as in certain connections it may represent e.g. the position of a body which is movable along the wire; a metallic body located near the wire may well be able to cause sufficient impedance change for giving rise to a pulse reflection.

What is claimed is:

1. A system for localizing a spot along an electric conductor in which an impedance change such as a break or a short circuit has taken place, comprising pulse generator means for transmitting a series of electric pulses to the conductor from one end thereof, and associated receiver means for detecting the return of pulses reflected from said spot, said generator and receiver means being connected to indicator means, operable to detect the time interval between transmission and reception of a reflected pulse and to produce a corresponding showing of the location of said spot, characterized in that said pulse generator means are operable to produce a series of pulse trains each comprising a series of pulses of individual durations or widths, preferably of steadily increasing or decreasing widths, ranging between a minimum width corresponding to the pulse running to and back again from a conductor point relatively close to said conductor end and a maximum width corresponding to the pulse running to and back again from at least a point near the opposite end of the conductor length to be supervised, said indicator means comprising detector means responsive to reception of a reflected pulse front when this reception coincides substantially with the termination of the individual pulse giving rise to the reflection of said pulse front, and pulse identification means operable to produce information selectively indicative of the single individual pulses, said detector means being operatively connected with said pulse identification means so as to cause the latter to produce information identifying the pulse giving rise to said detector response.

2. A system according to claim 1, in which the pulse generator means are so adapted that the pulses in said pulse trains are generated so as to have steadily increasing pulse widths, and wherein the pulse identification means comprises counter means operable to successively count the consecutive pulses and stop or read out the count in response to said detector means responding to reception of said reflected pulse front.

3. A system according to claim 1, in which said detector means are operatively connected with said generator means so as to be maintained open and operative for reception of a reflected pulse front during the entire duration of each pulse, but is made inoperative in immediate response to termination of the pulse.

4. A system according to claim 2, in which the counter is operated by the generated pulses, pulse width control means being provided for broadening pulses of very small width for safe operation of the counter.

5. A system according to claim 1, in which the pulse generator means are so adapted that the pulses in said pulse trains are generated so as to have steadily decreasing pulse widths, and wherein the pulse identification means comprises counter means operable to successively count the consecutive pulses and stop or read out the count in response to said detector means responding to reception of said reflected pulse front.

6. A system for localizing a spot along an electric conductor in which an impedance change such as a break or a short circuit has taken place, comprising:

pulse generator means for transmitting a series of electric pulse trains to the conductor from one end thereof, each of said pulse trains comprising a series of pulses of individual widths ranging between a minimum width corresponding to the pulse running to and back again from a conductor point relatively close to said conductor end and a maximum width corresponding to the pulse running to and back again from at least a point near the opposite end of the conductor length to be supervised;

detector means for detecting the return of a pulse front reflected from said spot when this pulse front reception coincides substantially with the termination of the individual pulse from said pulse train giving rise to the reflection of said pulse front and generating an output response; and pulse identification means connected to said pulse generator means and said detector means for producing information selectively indicative of the single individual pulses of each of said pulse trains, said pulse identification means producing information identifying the pulse giving rise to said detector response in accordance with a signal from said detector means so that the time interval between the transmission and the reception of the reflected pulse may be determined and the position of said spot from which said pulse was reflected may be located.

7. A system according to claim 6, wherein said detector means comprises means for operatively connecting said detector means to said generator means so that said detector means is maintained open and operative for reception of a reflected pulse front during the entire duration of each pulse, but is made inoperative in immediate response to termination of the pulse.

8. A system according to claim 7, wherein said pulse generator means comprises means for generating pulses in said pulse trains which have steadily increasing pulse widths.

9. A system according to claim 7, wherein said pulse generator means comprises means for generating said pulses in said pulse trains with steadily decreasing pulse widths.

10. A system according to claim 1, wherein said pulse identification means comprises counter means operable to successively count the consecutive pulses and to provide count information in response to said detector means responding to the reception of said reflected pulse front.

11. A system according to claim 7, wherein said pulse identification means comprises counter means operable to successively count the consecutive pulses and to provide count information in response to said detector means responding to the reception of said reflected pulse front.

12. A system according to claim 11, wherein said counter means comprises pulse width control means for broadening pulses of very small width supplied from said pulse generator means to enable said counter means to count said small width pulses.

* * * * *